United States Patent
Wu et al.

(10) Patent No.: US 9,448,487 B2
(45) Date of Patent: Sep. 20, 2016

(54) METHOD OF MANUFACTURING SEMICONDUCTOR AND EXPOSURE SYSTEM

(71) Applicant: MACRONIX International Co., Ltd., Hsinchu (TW)

(72) Inventors: Shih-Rung Wu, Hsinchu (TW); Rui-Ming Lai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 163 days.

(21) Appl. No.: 14/292,220

(22) Filed: May 30, 2014

(65) Prior Publication Data
US 2015/0287622 A1 Oct. 8, 2015

(30) Foreign Application Priority Data
Apr. 2, 2014 (TW) .............................. 103112314 A

(51) Int. Cl.
G03B 27/68 (2006.01)
G03F 7/20 (2006.01)

(52) U.S. Cl.
CPC ....... *G03F 7/70141* (2013.01); *G03F 7/70633* (2013.01)

(58) Field of Classification Search
CPC ........... G03F 7/70141; G03F 7/70633; H01L 21/31144; H01L 21/31155; H01L 21/67259
See application file for complete search history.

(56) References Cited

U.S. PATENT DOCUMENTS

| | | | | |
|---|---|---|---|---|
| 6,338,971 B1 * | 1/2002 | Yasuda | ................. | G03F 9/7046 438/14 |
| 7,349,752 B1 * | 3/2008 | Sturtevant | ........... | G03F 7/70625 257/E21.525 |
| 8,889,434 B2 * | 11/2014 | Tsen | ........................ | H01L 22/12 438/16 |
| 2002/0111038 A1 * | 8/2002 | Matsumoto | ........ | G03F 7/70458 438/763 |
| 2003/0033046 A1 * | 2/2003 | Yoshitake | ........... | G03F 7/70125 700/121 |
| 2005/0219484 A1 * | 10/2005 | Chiang | ............... | G03F 7/70633 355/53 |
| 2007/0021860 A1 * | 1/2007 | Gertrudus Simons | ............... | G03F 7/70516 700/121 |
| 2010/0028790 A1 * | 2/2010 | Seltmann | ............ | G03F 7/70525 430/30 |
| 2012/0029856 A1 * | 2/2012 | Cohen | .............. | G05B 19/41875 702/85 |
| 2012/0208301 A1 * | 8/2012 | Izikson | .................. | G05B 21/02 438/5 |
| 2012/0244461 A1 * | 9/2012 | Nagai | ................. | G03F 7/70525 430/30 |
| 2013/0059240 A1 * | 3/2013 | Van Der Schaar | . | G03F 7/70633 430/30 |
| 2013/0209923 A1 * | 8/2013 | Wu | .......................... | G03F 1/68 430/5 |
| 2014/0111779 A1 * | 4/2014 | Chen | ................... | G03F 7/70633 355/27 |
| 2015/0116688 A1 * | 4/2015 | Endo | ..................... | G03F 9/7046 355/72 |
| 2015/0145151 A1 * | 5/2015 | Van Der Schaar | . | G03F 7/70633 257/797 |
| 2015/0170904 A1 * | 6/2015 | Tsen | .................... | H01L 21/0274 438/14 |

* cited by examiner

*Primary Examiner* — Deoram Persaud
(74) *Attorney, Agent, or Firm* — J.C. Patents

(57) ABSTRACT

A method of manufacturing semiconductor and an exposure system are provided. The method includes the following step. A material layer is formed on a substrate. A patterned photoresist layer is formed a on the material layer and a monitor parameter group is produced from a state information of the patterned photoresist layer. The monitor parameter group is calculated based on a mathematic formula to obtain a virtual parameter. Whether the virtual parameter is less than a reference value is determined. A layout process is performed on the material layer when the virtual parameter is less than the reference value.

14 Claims, 8 Drawing Sheets

METHOD OF MANUFACTURING SEMICONDUCTOR AND EXPOSURE SYSTEM

CROSS-REFERENCE TO RELATED APPLICATION

This application claims the priority benefit of Taiwan application serial no. 103112314, filed on Apr. 2, 2014. The entirety of the above-mentioned patent application is hereby incorporated by reference herein and made a part of this specification.

BACKGROUND OF THE INVENTION

1. Field of the Invention

The invention relates to a manufacturing method and a processing system, and more particularly, relates to a method of manufacturing semiconductor and an exposure system.

2. Description of Related Art

With increasing IC integration level, dimensions of patterns are also gradually reduced day by day, thus, how to align multiple layers in a device has become one of important factors in manufacturing semiconductor. In other words, each layer must be accurately aligned to the others, so that circuits formed therein may match layout patterns and operate normally. Alignment is a critical step in a lithography process because a wafer needs to be aligned with patterns produced in previous steps in addition to be aligned in position and levelness on an exposure machine. Particularly, an accuracy in the alignment may influence critical dimension, property, and performance of the IC, as well as a production yield of the wafer. Accordingly, it is required to effectively monitor alignment behaviors between layers in a semiconductor device.

Generally, a method of monitoring the alignment behaviors is mainly done by setting control values of different items to the exposure machine, such that when an actual value measured after exposing the wafer deviates from the control value of one item set to the exposure machine, the exposure machine may send a warning and reject the wafer. In this case, the wafer to which the warning is targeted may require further detection or reworks. However, if a range for setting the control values is improper or requires frequent adjustments, which will cause false warnings and unnecessary reworks to seriously influence productivity and waste resources on production line. Therefore, how to effectively monitor the alignment behaviors between layers while reducing a frequency of the false warning is an important issue to be discussed in the field.

SUMMARY OF THE INVENTION

The invention is directed to a method of manufacturing semiconductor, which includes: forming a material layer on a substrate, forming a patterned photoresist layer on the material layer and producing a monitor parameter group including a plurality of monitor parameters from a state information of the patterned photoresist layer, calculating the monitor parameter group based on a mathematic formula to obtain a virtual parameter, and performing a layout process on the material layer when the virtual parameter is less than a reference value.

In an embodiment of the invention, the state information of the patterned photoresist layer is indicated by at least one overlay difference between at least one alignment mark of the substrate and at lease one alignment mark of a photomask.

In an embodiment of the invention, the monitor parameter group includes at least one vector-oriented factor and at least one non vector-oriented factor. The at least one vector-oriented factor includes a rotation factor, an orthogonality factor and an expansion factor. The at least one non vector-oriented factor includes a translation factor.

In an embodiment of the invention, the mathematic formula includes:

$$V = |C_1 \times T + C_2 \times R + C_3 \times O + C_4 \times E| \quad (1)$$

in formula (1), V is a virtual parameter; T, R, O, E are monitor parameters in practical operation of an alignment machine for forming the patterned photoresist layer; wherein T is a value of the translation factor; R is a value of the rotation factor; O is a value of the orthogonality factor; E is a value of the expansion factor; and $C_1$, $C_2$, $C_3$ and $C_4$ are environmental constants; and the reference value is:

$$B = k \times N \quad (2)$$

in formula (2), B is the reference value; k is an environmental constant; and N is defined as formula (3) below:

$$N = |C_1 \times T' + C_2 \times R' + C_3 \times O' + C_4 \times E'| \quad (3)$$

in formula (3), T', R', O', E' are values of control parameters set to the alignment machine, wherein T' is a value of the translation factor; R' is a value of the rotation factor; O' is a value of the orthogonality factor; E' is a value of the expansion factor; and $C_1$, $C_2$, $C_3$ and $C_4$ are the environmental constants as defined above.

In an embodiment of the invention, the method further includes outputting the state information of the patterned photoresist layer to a control system to generate a batch report. The batch report includes the monitor parameter group.

In an embodiment of the invention, the monitor parameter group includes a maximum value and a minimum value of a local defocus result, a maximum value and a minimum value of a leveling error result, and a maximum value and a minimum value of an alignment result.

In an embodiment of the invention, the mathematic formula includes:
a range of each of the monitor parameters=the maximum value of each of the monitor parameters−the minimum value of each of the monitor parameters.
wherein the range of each of the monitor parameters is the virtual parameter.

In an embodiment of the invention, a warning is sent when the virtual parameter is greater than the reference value.

In an embodiment of the invention, the layout process includes an etching process for patterning the material layer.

In an embodiment of the invention, the layout process includes an ion implantation process.

The invention provides an exposure system, which includes a stepper and a monitor device. The monitor device is connected to the stepper, and stores the state information of the patterned photoresist layer after the exposure step is performed. The monitor parameter group is produced from the state information of the patterned photoresist layer, and the monitor parameter group is calculated according to the mathematic formula to obtain a virtual parameter. A layout process is performed on the material layer when the virtual parameter is less than a reference value.

In an embodiment of the invention, the monitor device includes an alignment monitor device installed in the stepper. The state information of the patterned photoresist layer is indicated by at least one overlay difference between at least one alignment mark of the substrate and at lease one alignment mark of a photomask. The monitor parameter group includes at least one vector-oriented factor and at least one non vector-oriented factor. The at least one vector-oriented factor includes a rotation factor, an orthogonality factor and an expansion factor. The at least one non vector-oriented factor includes a translation factor. Further, the mathematic formula includes:

$$V=|C_1 \times T+C_2 \times R+C_3 \times O+C_4 \times E| \quad (1)$$

in formula (1), V is a virtual parameter; T, R, O, E are monitor parameters in practical operation of an alignment machine for forming the patterned photoresist layer; wherein T is a value of the translation factor; R is a value of the rotation factor; O is a value of the orthogonality factor; E is a value of the expansion factor; and $C_1$, $C_2$, $C_3$ and $C_4$ are environmental constants; and the reference value is:

$$B=k \times N \quad (2)$$

in formula (2), B is the reference value; k is an environmental constant; and N is defined as formula (3) below:

$$N=|C_1 \times T'+C_2 \times R'+C_3 \times O'+C_4 \times E'| \quad (3)$$

in formula (3), T', R', O', E' are values of control parameters set to the alignment machine, wherein T' is a value of the translation factor; R' is a value of the rotation factor; O' is a value of the orthogonality factor; E' is a value of the expansion factor; and $C_1$, $C_2$, $C_3$ and $C_4$ are the environmental constants as defined above.

In an embodiment of the invention, the monitor device is installed in the control system. The control system outputs a batch report.

In an embodiment of the invention, the batch report includes the monitor parameter group including a plurality of monitor parameters.

In an embodiment of the invention, the monitor parameter group includes a maximum value and a minimum value of a local defocus result, a maximum value and a minimum value of a leveling error result, and a maximum value and a minimum value of an alignment result.

In an embodiment of the invention, the mathematic formula includes:
a range of each of the monitor parameters=the maximum value of each of the monitor parameters–the minimum value of each of the monitor parameters
wherein the range of each of the monitor parameters is the virtual parameter.

The invention is also directed to a method of manufacturing semiconductor, which includes: forming a material layer on a substrate, forming a patterned photoresist layer on the material layer and producing a monitor parameter group including a plurality of monitor parameters from a state information of the patterned photoresist layer, wherein the state information of the patterned photoresist layer is indicated by at least one overlay difference between at least one alignment mark of the substrate and at lease one alignment mark of a photomask, calculating the monitor parameter group based on a mathematic formula to obtain a virtual parameter, wherein the mathematic formula is:

$$V=|C_1 \times T+C_2 \times R+C_3 \times O+C_4 \times E| \quad (1)$$

in formula (1), V is a virtual parameter; T, R, O, E are monitor parameters in practical operation of an alignment machine for forming the patterned photoresist layer, wherein T is a value of a translation factor, R is a value of a rotation factor, O is a value of an orthogonality factor, and E is a value of an expansion factor; and $C_1$, $C_2$, $C_3$ and $C_4$ are environmental constants; and
the reference value is:

$$B=k \times N \quad (2)$$

in formula (2), B is the reference value; k is an environmental constant; and N is defined as formula (3) below:

$$N=|C_1 \times T'+C_2 \times R'+C_3 \times O'+C_4 \times E'| \quad (3)$$

in formula (3), T', R', O', E' are values of control parameters set to the alignment machine, wherein T' is a value of a translation factor; R' is a value of a rotation factor; O' is a value of an orthogonality factor; E' is a value of an expansion factor; and $C_1$, $C_2$, $C_3$ and $C_4$ are the environmental constants as defined above, performing a layout process on the material layer when the virtual parameter is less than a reference value, and sending a warning when the virtual parameter is greater than the reference value.

In an embodiment of the invention, the layout process includes an etching process for patterning the material layer.

In an embodiment of the invention, the layout process includes an ion implantation process.

Based on above, the method of manufacturing semiconductor and the exposure system provided by the invention are capable of calculating the monitor parameter group after the patterned photoresist layer is exposed to obtain the virtual parameter, and comparing the virtual parameter with the set reference value, so as to monitor the accuracy of the alignment to ensure product quality. The method of manufacturing semiconductor is capable of reducing a frequency of the false warning sent by an exposure machine to avoid unnecessary reworks and effectively monitoring alignment behaviors between layers.

To make the above features and advantages of the disclosure more comprehensible, several embodiments accompanied with drawings are described in detail as follows.

DESCRIPTION OF THE EMBODIMENTS

Figure 1:
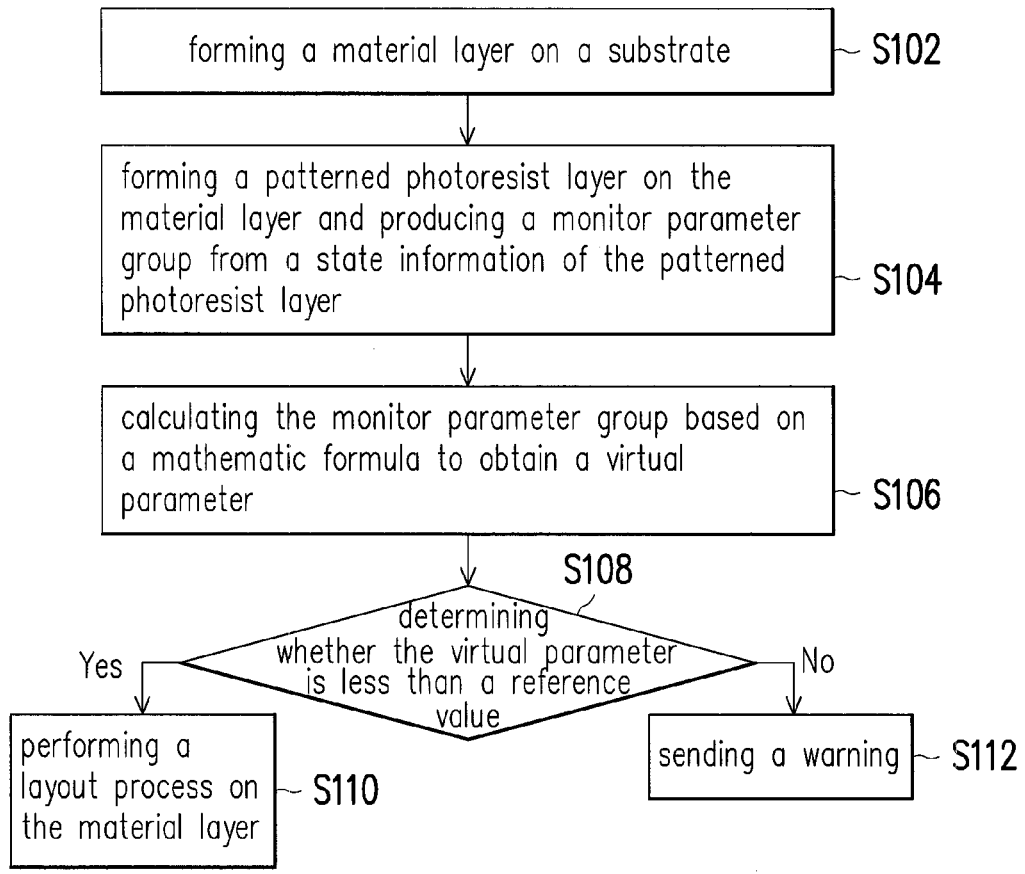
FIG. 1 is a flowchart illustrating a method of manufacturing semiconductor according to first embodiment of the invention.
Figure 2:
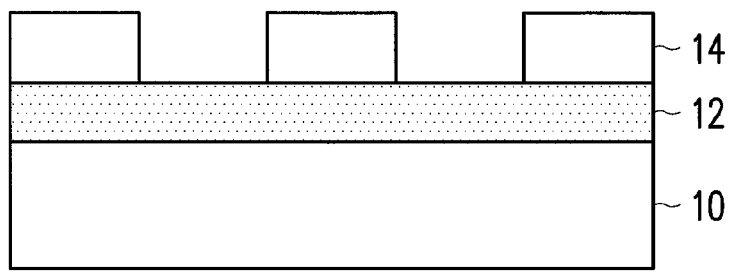
FIG. 2 is a schematic diagram of a semiconductor according to first embodiment of the invention.

FIG. 1 is a flowchart illustrating a method of manufacturing semiconductor according to first embodiment of the invention. FIG. 2 is a schematic diagram of a semiconductor according to first embodiment of the invention.

A method of manufacturing semiconductor of the invention utilizes a mathematic formula to comprehensively consider a plurality of monitor parameters influencing a state of a wafer to reduce a frequency of false warning to avoid unnecessary reworks so as to effectively monitor an exposure process of the wafer.

The flowchart illustrating the method of manufacturing semiconductor according to first embodiment of the invention is as shown by steps S102 to S112 in FIG. 1. In step S102, a material layer 12 is formed on a substrate 10. Next, in step S104, a patterned photoresist layer 14 is formed on the material layer 12 and a monitor parameter group is produced from a state information of the patterned photoresist layer 14. Subsequently, in step S106, the monitor parameter group is calculated based on a mathematic formula to obtain a virtual parameter. Then, in step S108, whether the virtual parameter is less than a reference value is determined. Thereafter, in step S110, a layout process is performed on the material layer 12 when the virtual parameter is less than the reference value. Additionally, in step S112, a warning is sent when the virtual parameter is greater than the reference value. Detailed steps and description for the above are provided as follows.

Referring to FIG. 1 and FIG. 2, in step S102, the substrate 10 is provided. The substrate 10 may include a semiconductor material, an insulation material, a conductor material or any combination thereof. The substrate 10 includes a single-layer structure or a multi-layer structure. In addition, a silicon on insulator (SOI) may also be used. In an embodiment of the invention, the substrate 10 is, for example, the semiconductor material, and the substrate 10 includes the material layer 12. The material layer 12 includes any suitable insulator, conductor, or semiconductor materials, such as silicon oxide, polysilicon materials and so on, but the invention is not limited thereto. A method of forming the material layer 12 includes a CVD process or a spin coating process and so on, for example.

Next, in step S104, the patterned photoresist layer 14 is formed on the material layer 12 and the monitor parameter group is produced from the state information of the patterned photoresist layer 14. Therein, a method of forming the patterned photoresist layer 14 on the material layer 12 includes, for example, forming a photoresist layer (not illustrated) on the material layer 12 first, followed by performing exposure and development processes on the photoresist layer, thereby forming the patterned photoresist layer 14. In a semiconductor process, an exposure step includes, for example, an alignment step, an irradiation step, a pattern transferring step and so on. The alignment step is to align at least one alignment mark of the substrate 10 with at least one alignment mark of a photomask (not illustrated).

During the alignment step, by setting control parameters to an alignment machine, the at least one alignment mark of the substrate 10 may be aligned with the at least one alignment mark of the photomask as accurate as possible. The control parameters of the alignment machine include a non vector-oriented factor and a vector-oriented factor. The non vector-oriented factor is, for example, a translation factor T'. The vector-oriented factor is, for example, a rotation factor R', an orthogonality factor O' and an expansion factor E'. Generally, if the control parameters of the alignment machine is not controlled properly, a misalignment between the alignment mark of the photomask and the alignment mark of the substrate may occur, as shown in FIG. 3A to FIG. 3E.

Figure 3A:
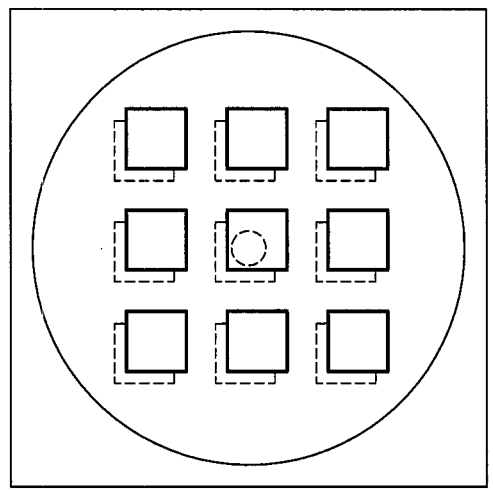
FIG. 3A is a schematic diagram illustrating a difference between a pattern of a wafer being exposed and a predetermined pattern, which is effected by a translation factor in the conventional art.
Figure 3B:
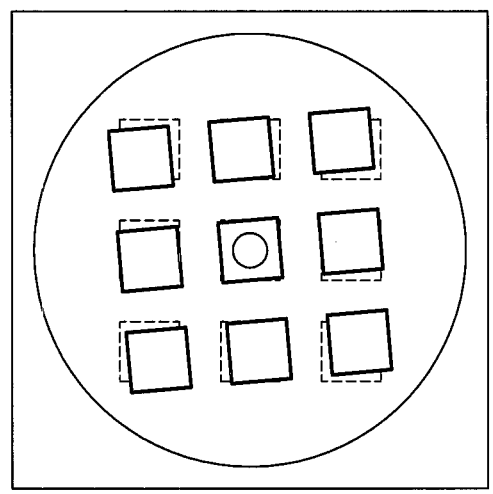
FIG. 3B is a schematic diagram illustrating a difference between a pattern of a wafer being exposed and a predetermined pattern, which is effected by a rotation factor in the conventional art.
Figure 3C:
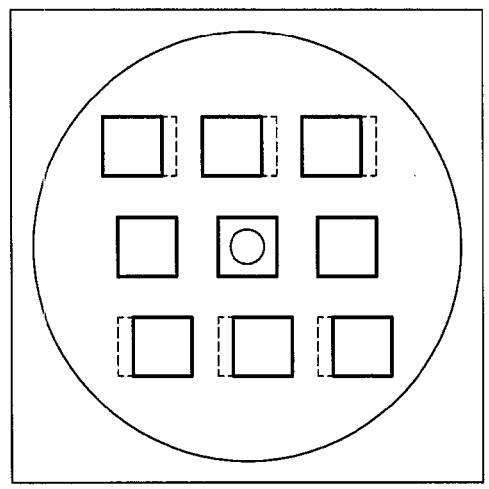
FIG. 3C is a schematic diagram illustrating a difference between a pattern of a wafer being exposed and a predetermined pattern, which is effected by an orthogonality factor in the conventional art.
Figure 3D:
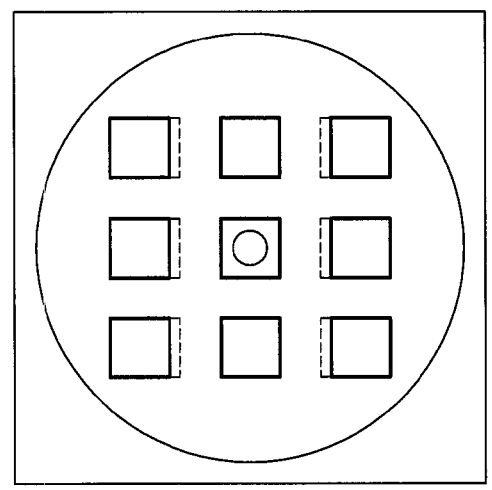
FIG. 3D is a schematic diagram illustrating a difference between a pattern of a wafer being exposed and a predetermined pattern, which is effected by an expansion factor in the conventional art.
Figure 3E:
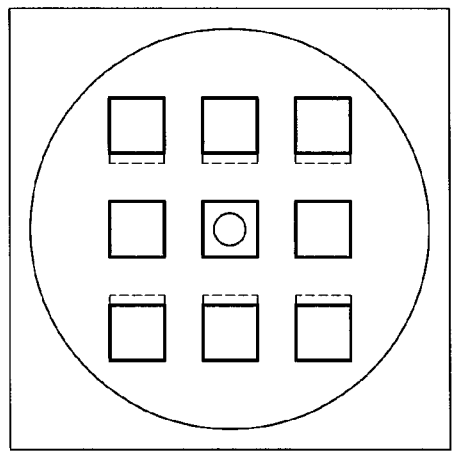
FIG. 3E is another schematic diagram illustrating a difference between a pattern of a wafer being exposed and a predetermined pattern, which is effected by an expansion factor in the conventional art.

FIG. 3A is a schematic diagram illustrating influences effected by the translation factor to a pattern of the patterned photoresist layer. FIG. 3B is a schematic diagram illustrating influences effected by the rotation factor to a pattern of the patterned photoresist layer. FIG. 3C is a schematic diagram illustrating influences effected by the orthogonality factor to a pattern of the patterned photoresist layer. FIG. 3D is a schematic diagram illustrating influences effected by the expansion factor to a pattern of the patterned photoresist layer. FIG. 3E is another schematic diagram illustrating influences effected by the expansion factor to a pattern of the patterned photoresist layer. In FIG. 3A to FIG. 3E, dashed-line patterns represent predetermined patterns; and the solid-line patterns represent patterns of the patterned photoresist layer on the substrate.

Referring to FIG. 3A, during the alignment step performed on the photomask and the wafer, if the translation factor T' of the alignment machine is not controlled properly, the misalignment between the alignment mark of the substrate and the alignment mark of the photomask may occur because of an overall offset between the photomask and the wafer. That is, because a shift is generated due to original points of the alignment marks of the photomask and the substrate not being overlayed, thus a shift may be generated between the patterned photoresist layer and the predetermined pattern.

Referring to FIG. 3B, during the alignment step performed on the photomask and the wafer, if the rotation factor R' of the alignment machine is not controlled properly, although the original points of both the alignment mark of the substrate and the alignment mark of the photomask are overlayed, a rotation is generated between the photomask and the wafer to cause a rotation in angles (the rotation in clockwise direction or counter-clockwise direction). FIG. 3B illustrates the rotation in counter-clockwise direction.

Referring to FIG. 3C, during the alignment step performed on the photomask and the wafer, if the orthogonality factor O' of the alignment machine is not controlled properly, although the original points of both the alignment mark of the substrate and the alignment mark of the photomask are overlayed, a normal to a plane of the photomask is not orthogonal to a plane of the wafer (i.e., the plane of the photomask is not parallel to the plane of the substrate). This may be caused by a base of wafer maintained at horizontal level while the photomask is not. This may also be caused by the photomask maintained at horizontal level while the based mounting the wafer is not.

Referring to FIGS. 3D and 3E, during the alignment step performed on the photomask and the wafer, if the expansion factor E' of the alignment machine is not controlled properly, although the original points of both the alignment mark of the substrate and the alignment mark of the photomask are overlayed, shifts in different directions may occur on two directions of the same dimension. More specifically, referring to FIG. 3D, the original points of both the alignment mark of the substrate and the alignment mark of the photomask are overlayed, but a +X shift occurs on wafer patterns in a +X direction, whereas a −X shift occurs on wafer patterns in a −X direction. Referring to FIG. 3E, the original points of both the alignment mark of the substrate and the alignment mark of the photomask are overlayed, but a +Y shift occurs on wafer patterns in a +Y direction, whereas a −Y shift occurs on wafer patterns in a −Y direction.

Although, during the alignment, by setting control parameters of an alignment machine, the at least one alignment mark of the substrate may be aligned with the at least one alignment mark of the photomask as accurate as possible, but after the alignment step is practically performed, a practical alignment result may be represented according to an overlay difference between the alignment mark of the substrate and the alignment mark of the photomask, and referred to as a state information of the wafer hereinafter. In an embodiment of the invention, the state information of the wafer is, for example, a state information of the patterned photoresist layer.

Figure 4A:
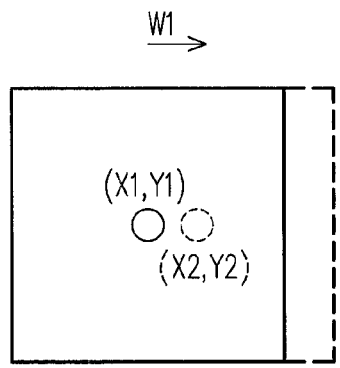
FIG. 4A is a schematic diagram illustrating a shift difference between an alignment mark of the substrate and an alignment mark of the photomask.
Figure 4B:
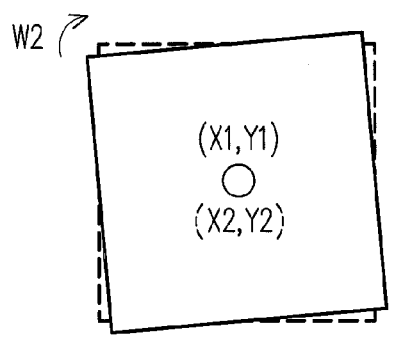
FIG. 4B is a schematic diagram illustrating a rotation difference between an alignment mark of the substrate and an alignment mark of the photomask.

FIG. 4A is a schematic diagram illustrating a shift difference between an alignment mark of the substrate and an alignment mark of the photomask. FIG. 4B is a schematic diagram illustrating a rotation difference between an alignment mark of the substrate and an alignment mark of the photomask.

In an embodiment of the invention, as shown in FIG. 4A, the overlay difference is, for example, a shift difference W1 (e.g., x2−x1) in X-direction or Y-direction of a center (x1, y1) of the alignment mark of the substrate with respect to a center (x2, y2) of the alignment mark of the photomask. In another embodiment of the invention, as shown in FIG. 4B, the overlay difference is, for example, a rotation difference W2 generated in clockwise direction or counter-clockwise direction when the center (x1, y1) of the alignment mark of the substrate is overlayed with the center (x2, y2) of the alignment mark of the photomask. In another embodiment, the overlay difference may include both the rotation difference and the shift difference.

After the alignment step is completed, the monitor parameter group including monitor parameters in practical operation of the alignment machine may be obtained according to the overlap difference (the state information of the patterned photoresist layer 14) of the alignment mark of the substrate 10 with respect to the alignment mark of the photomask. In an embodiment of the invention, the monitor parameter group includes a group of factors influencing overlay alignment, such as at least one non vector-oriented factor and at least one vector-oriented factor. The non vector-oriented factor is, for example, a translation factor T. The vector-oriented factor includes a rotation factor R, an orthogonality factor O and an expansion factor E.

Subsequently, referring to FIG. 1, in step S106, the monitor parameter group (the translation factor T, the rotation factor R, the orthogonality factor O and the expansion factor E) in practical operation of the alignment machine is calculated based on a mathematic formula to obtain a virtual parameter V. In an embodiment of the invention, the mathematic formula is as shown by formula (1) below.

$$V=|C_1 \times T + C_2 \times R + C_3 \times O + C_4 \times E| \quad (1)$$

In formula (1), T, R, O, E are the monitor parameters in practical operation of the alignment machine. T is a value of the translation factor; R is a value of the rotation factor; O is a value of the orthogonality factor; E is a value of the expansion factor. In formula (1), $C_1$, $C_2$, $C_3$ and $C_4$ are environmental constants, which may include different values based on different work environments (e.g., different environmental constants $C_1$, $C_2$, $C_3$ and $C_4$ may be generated when the exposure step is performed in different laboratories). In an embodiment of the invention, the environmental constants $C_1$, $C_2$, $C_3$ and $C_4$ may be environmental constants for each of the laboratories which are obtained by the different laboratories inputting exposure data or empirical values to a database followed by utilizing methods of counting and analyzing. The environmental constants $C_1$, $C_2$, $C_3$ and $C_4$ may respectively be used for weighting the translation factor T, the rotation factor R, the orthogonality factor O and the expansion factor E. The virtual parameter V may be obtained after calculating the monitor parameter group based on formula (1).

Subsequently, referring to FIG. 1, in step S108, whether the virtual parameter V is less than a reference value B is determined. The reference value B is defined as formula (2) below:

$$B = k \times N \quad (2)$$

In formula (2), N is defined as formula (3) below:

$$N=|C_1 \times T' + C_2 \times R' + C_3 \times O' + C_4 \times E'| \quad (3)$$

Therein, T', R', O', E' are values of the control parameters set to the alignment machine. T' is a value of the translation factor; R' is a value of the rotation factor; O' is a value of the orthogonality factor; E' is a value of the expansion factor; and the environmental constants $C_1$, $C_2$, $C_3$ and $C_4$ in aforesaid formula (1) may be an environmental constant k suitable for each of the laboratories which are obtained by the different laboratories inputting exposure data or empirical values to a database followed by utilizing statistic analysis methods. The reference value B may be obtained by weighting N with the environmental constant k.

Referring to step S110 of FIG. 1, when the calculated virtual parameter V is less than the reference value B (i.e., V<B), namely, $$|C_1 \times T + C_2 \times R + C_3 \times O + C_4 \times E| < k|C_1 \times T' + C_2 \times R' + C_3 \times O' + C_4 \times E'|$$

the layout process is performed on the material layer 12. The layout process includes performing a patterning process (e.g., an etching process) or an ion implantation process on the material layer 12.

Referring to step S112 of FIG. 1, when the calculated virtual parameter V is greater than the reference value B (i.e., V>B), namely, $$|C_1 \times T + C_2 \times R + C_3 \times O + C_4 \times E| > k|C_1 \times T' + C_2 \times R' + C_3 \times O' + C_4 \times E'|$$

the warning is only sent at that time. After the warning is sent, subsequent processes may include, for example, rejecting the wafer from the alignment machine, or further performing detection or reworks to the wafer for re-performing the exposure step again. Descriptions for the subsequent processes are not repeated hereinafter.

In view of above, after the wafer is exposed, the virtual parameter V is obtained by calculating the values of the monitor parameters based on the mathematic formula (1), the reference value B is obtained by calculating the values of the control parameters of the alignment machine based on the mathematic formulae (2) and (3), and then the virtual parameter V is compared with the reference value B. The layout process is performed on the material layer when the calculated virtual parameter V is less than the reference value B; and the warning is sent only when the calculated virtual parameter V is greater than the reference value B. In other words, the method of manufacturing semiconductor of the invention comprehensively considers a plurality of factors influencing the overlay alignment (the translation factor, the rotation factor, the orthogonality factor and the expansion factor). Therefore, alignment behaviors between layers may be effectively monitored, a frequency of the false warning due to single factor sent by an exposure machine may be reduced to avoid unnecessary reworks.

Figure 5:
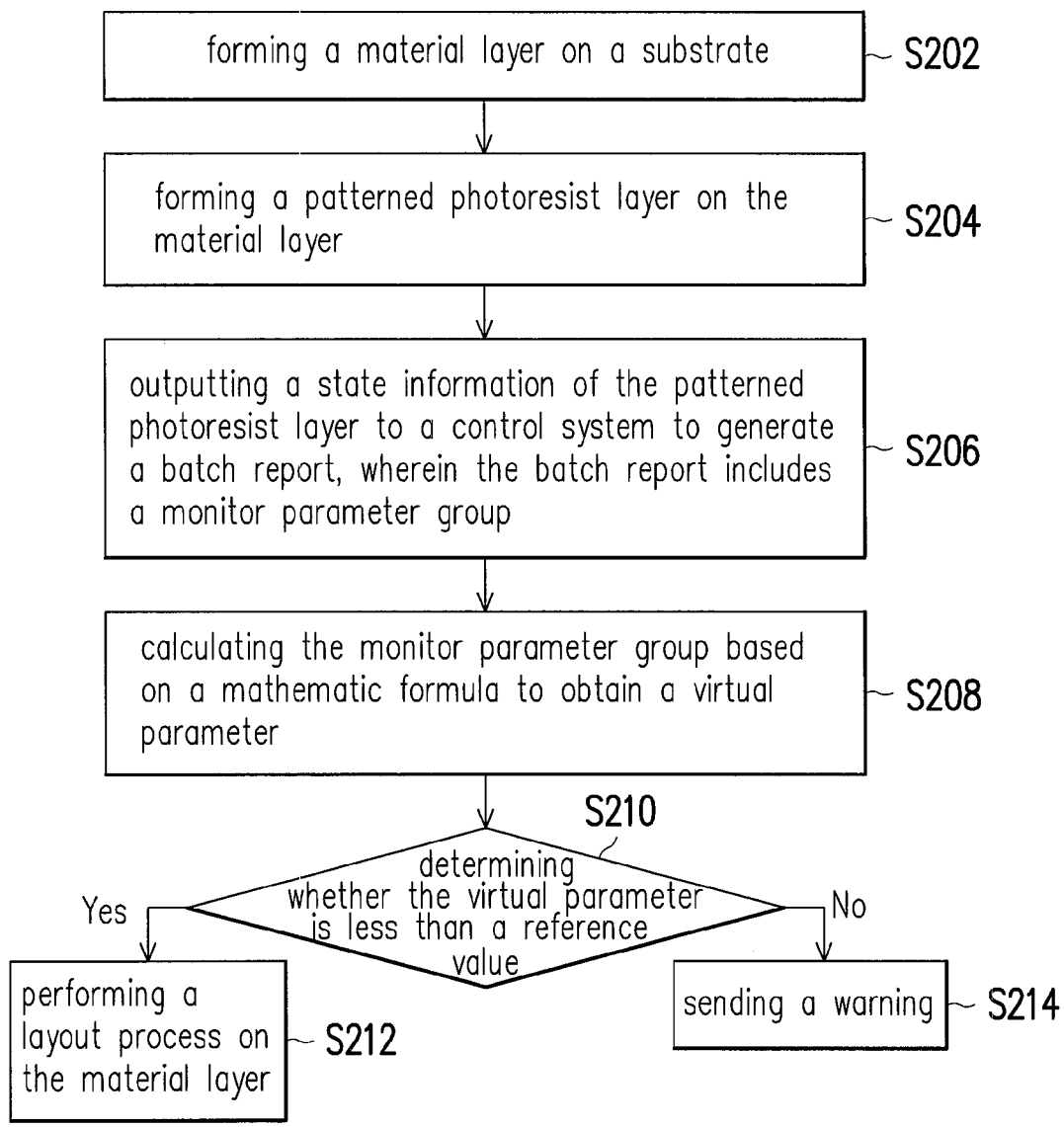
FIG. 5 is a flowchart illustrating a method of manufacturing semiconductor according to second embodiment of the invention.

FIG. 5 is a flowchart illustrating a method of manufacturing semiconductor according to second embodiment of the invention.

The flowchart illustrating the method of manufacturing semiconductor according to second embodiment of the invention is as shown by steps S202 to S214 in FIG. 5. In step S202, a material layer is formed on a substrate. Next, in step S204, a patterned photoresist layer is formed on the material layer. Then, in step S206, a state information of the patterned photoresist layer is outputted to a control system to generate a batch report, wherein the batch report includes a monitor parameter group. Subsequently, in step S208, the monitor parameter group is calculated based on a mathematic formula to obtain a virtual parameter. Then, in step S210, whether the virtual parameter is less than a reference value is determined. Thereafter, in step S212, a layout process is performed on the material layer 12 when the virtual parameter is less than the reference value. Additionally, in step S214, a warning is sent when the virtual parameter is greater than the reference value. Detailed steps and description for the above are provided as follows. A semiconductor structure formed in step S202 to step S204 may refer to the schematic diagram of FIG. 2.

Referring to FIG. 5, in step S202, a material layer 12 is formed on a substrate 10. A material and a method of forming the substrate 10 and the material layer 12 are as described in the foregoing embodiments, which are not repeated hereinafter. Subsequently, in step S204, a patterned photoresist layer 14 is formed on the material layer 12. Therein, a method of forming the patterned photoresist layer 14 on the material layer 12 includes, for example, forming a photoresist layer (not illustrated) on the material layer 12 first, followed by performing exposure and development processes on the photoresist layer, thereby forming the patterned photoresist layer 14. In the semiconductor process, an exposure step includes an alignment step, an irradiation step and a pattern transfer step. The invention may be used for the alignment step and the irradiation step in the exposure step.

Next, referring to step S206, during the exposure step or after the exposure step is performed, a state information of the patterned photoresist layer 14 is outputted to a control system to generate a batch report, wherein the batch report includes the monitor parameter group. For instance, the control system may monitor operating conditions of the exposure machine (or known as the state information of the patterned photoresist layer 14), and output the operating conditions (or known as the state information of the patterned photoresist layer 14) to the batch report. The batch report may be used to monitor an exposure quality of the wafer. In an embodiment, the state information of the patterned photoresist layer 14 in the batch report may be indicated by the monitor parameter group. The monitor parameter group includes an overlay condition (an alignment result), a focus condition (a local defocus result) or a transferring condition (a leveling error result) or a combination thereof.

Thereafter, referring to FIG. 5, in step S208, the monitor parameter group is calculated based on a mathematic formula to obtain a virtual parameter. The monitor parameter group includes a maximum value and a minimum value of each of the monitor parameter. Aforesaid mathematic formulae are used to obtain a difference between the maximum value and the minimum value of each of the monitor parameter, and the obtained difference (or known as a range of the monitor parameter) is the virtual parameter. In other words, the monitor parameter group may be the maximum value and the minimum value among deviations of the alignment result; and the virtual parameter is the difference (the range) between the maximum value and the minimum value among the deviations of the alignment result. The monitor parameter group may also be the maximum value and the minimum value among deviations of the local defocus result; and the virtual parameter is the difference (the range) between the maximum value and the minimum value among the deviations of the local defocus result. The monitor parameter group may be the maximum value and the minimum value among deviations of the leveling error result; and the virtual parameter is the difference (the range) between the maximum value and the minimum value among the deviations of the leveling error result. The embodiment of the monitor parameter group is described in detail below with reference to the maximum value and the minimum value among the deviations of the alignment result for example.

Figure 6A:
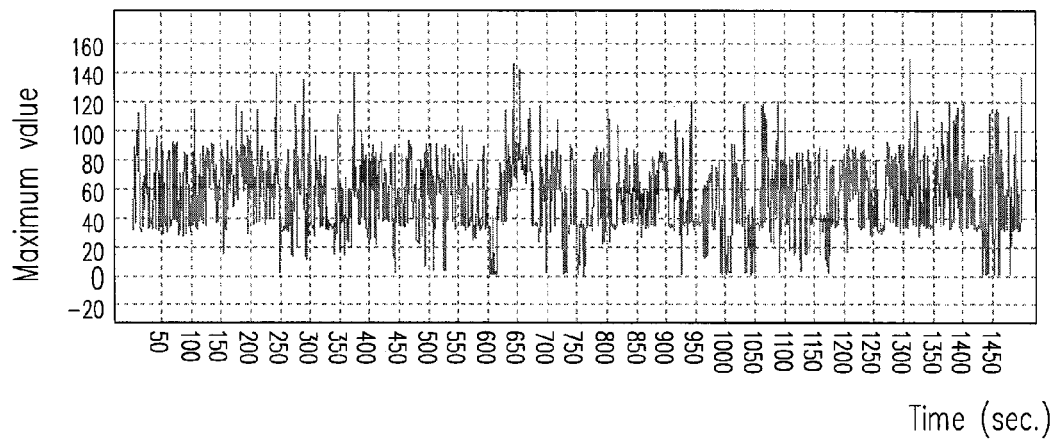
FIG. 6A is a chart illustrating a relation between a maximum value of deviations of the alignment result and time.
Figure 6B:
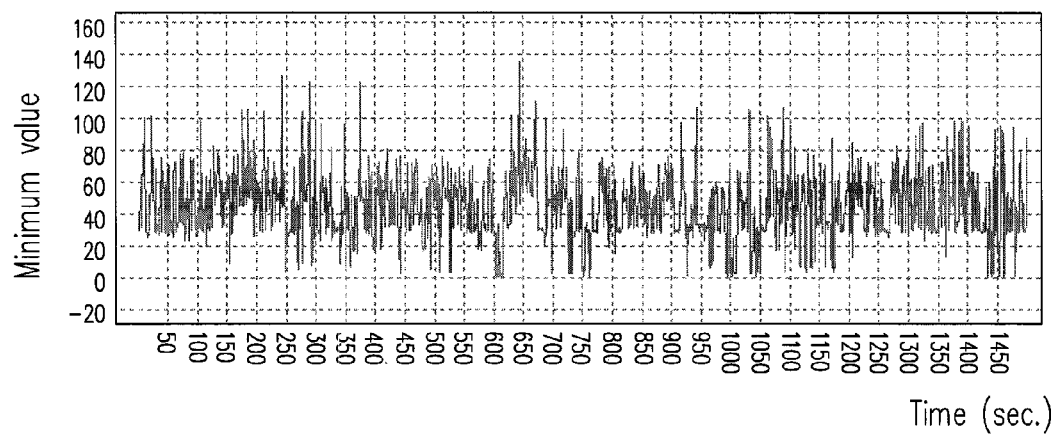
FIG. 6B is a chart illustrating a relation between a minimum value in deviations of the alignment result and time.
Figure 6C:
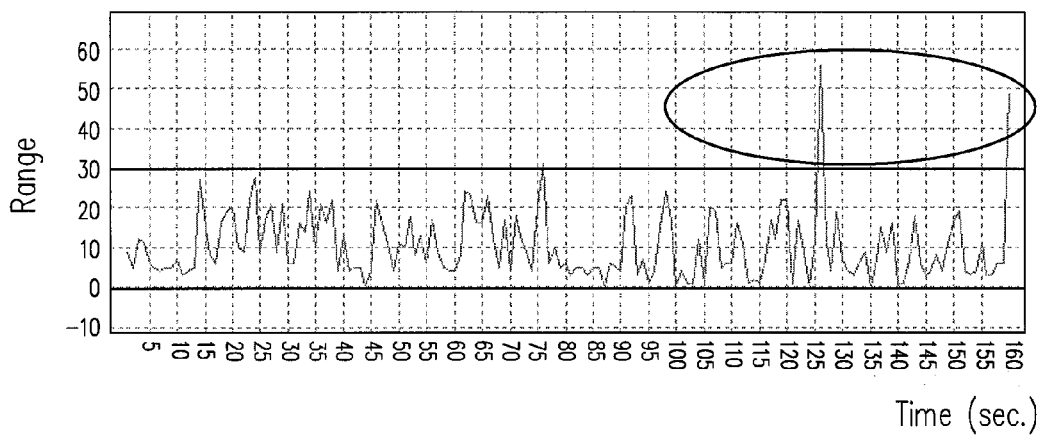
FIG. 6C is a chart illustrating a relation between a range in deviations of the alignment result and time.

FIG. 6A is a chart illustrating a relation between a maximum value of deviations of the alignment result and time. FIG. 6B is a chart illustrating a relation between a minimum value in deviations of the alignment result and time. FIG. 6C is a chart illustrating a relation between a range in deviations of the alignment result and time.

Referring to FIG. 6A to FIG. 6C, in the embodiment that utilizes the maximum value and the minimum value among the deviations of the alignment result as the monitor parameter group, a difference (as shown in FIG. 6C) between the maximum value (as shown in FIG. 6A) and the minimum value (as shown FIG. 6B) among the deviations of the alignment result may serve as the virtual parameter. In view of the result in FIG. 6C, the difference between the maximum value among the deviations of the alignment result and the minimum value among the deviations of the alignment result mostly falls within a region, and such region is defined as the reference value.

Thereafter, referring to FIG. 5, in step S210, whether the virtual parameter is less than the reference value is determined In step S212, the layout process is performed on the material layer 12 when the calculated virtual parameter (i.e., the range of the monitor parameter) is less than the reference value. The layout process includes performing a patterning process (e.g., an etching process) or an ion implantation process on the material layer 12. Additionally, in step S214, a warning is sent when the virtual parameter (i.e., the range of the monitor parameter) is greater than the reference value. Accordingly, a point where anomaly substantially occurs may be found with exclusion of machine conditions and the environmental factors. Take FIG. 6C for example, at the 125th second after the alignment step is performed, the virtual parameter (i.e., the range of the monitor value) is greater than the reference value, it may then be determined that anomaly occurs at that time, so that the control system may send the warning thereby effectively monitor the alignment behaviors between layers of the wafer.

Figure 7A:
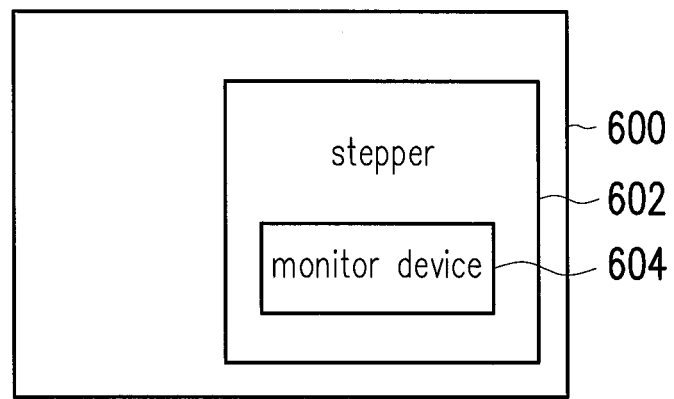
FIG. 7A illustrates an exposure system according to the embodiments of the invention.
Figure 7B:
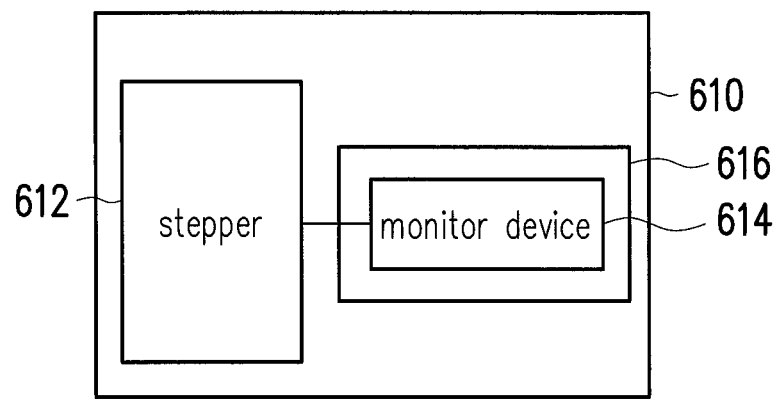
FIG. 7B illustrates another exposure system according to the embodiments of the invention.

FIG. 7A illustrates an exposure system according to the embodiments of the invention. FIG. 7B illustrates another exposure system according to the embodiments of the invention.

Referring to FIG. 7A, an exposure system 600 of the invention includes a stepper 602 and a monitor device 604. The monitor device 604 may be connected to the stepper 602, and stores a state information of a patterned photoresist layer after the exposure step (the alignment step) is performed. In an embodiment, the monitor device 604 includes an alignment monitor device, and the alignment monitor device is installed in the stepper 602. A monitor parameter group after the alignment step is practically performed may be obtained according to the state information of the aligned patterned photoresist. In an embodiment, the state information of the patterned photoresist layer is, for example, indicated by at least one overlay difference between at least one alignment mark of a substrate and at least one alignment mark of the photomask; and the monitor parameter group includes at least one factor influencing overlay alignment, such as at least one non vector-oriented factor and sat least one vector-oriented factor. Description regarding the vector-oriented factor and the non vector-oriented factor may refer to the foregoing embodiments. The non vector-oriented factor includes a translation factor; and the vector-oriented factor includes a rotation factor, an orthogonality factor and an expansion factor. Descriptions regarding the overlay difference, the translation factor, the rotation factor, the orthogonality factor and the expansion factor are as described in the foregoing embodiments, which are not repeated hereinafter. The monitor device 604 may calculate the monitor parameter group based on a mathematic formula to obtain a virtual parameter. In an embodiment, the mathematic formula and a definition thereof are as described in formula (1) above, and the reference value is as described in formula (2). A warning is sent when the virtual parameter is greater than the reference value.

FIG. 7B illustrates another exposure system according to the embodiments of the invention.

Referring to FIG. 7B, an exposure system 610 of the invention includes a stepper 612 and a monitor device 614. The monitor device 614 may be connected to the stepper 612, and stores a state information of a patterned photoresist layer after the exposure step is performed. In an embodiment, the monitor device 614 is installed outside the stepper 612. For example, the monitor device 614 is installed in a control system 616.

The control system 616 is capable of outputting a batch report. The batch report may obtain a monitor parameter group after the exposure step is practically performed according to the state information of the patterned photoresist layer during the exposure step. For instance, the control system may control operating conditions of the exposure machine (or known as the state information of the patterned photoresist layer) for exposing the wafer, and output the operating conditions (or known as the state information of the patterned photoresist layer) to the batch report. The batch report may be used to monitor an exposure quality of the wafer. The state information of the patterned photoresist layer in the batch report may be indicated by the monitor parameter group. The monitor parameter group includes an overlay condition (an alignment result), a focus condition (a local defocus result) or a transferring condition (a leveling error result) or a combination thereof. The batch report includes the virtual parameter obtained by calculating the monitor parameter group based on the mathematic formula. The control system 616 may send a warning when the virtual parameter is greater than the reference value. The monitor parameter group includes a maximum value and a minimum value of the monitor parameter. Aforesaid mathematic formulae are used to obtain a difference between the maximum value and the minimum value of the monitor parameter, and the obtained difference (or known as a range of the monitor parameter) is servered as the virtual parameter.

In view of above, the exposure system provided by the invention includes the monitor device capable of calculating the monitor parameter group based on the mathematic formula, and comparing the obtained virtual parameter with the reference value required in the process to ensure product quality. In other words, the exposure system of the invention may comprehensively consider the monitor parameter group for reducing a frequency of the false warning due to single factor sent by an exposure machine to avoid unnecessary reworks, so as to effectively monitor the alignment behaviors between layers of the wafer.

Figure 8:
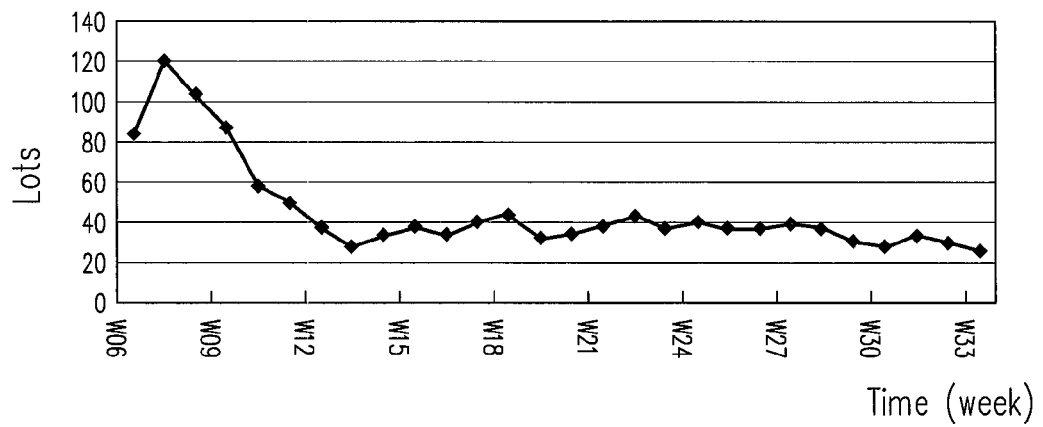
FIG. 8 is a trend chart illustrating a number of the wafers being rejected.
Figure 9:
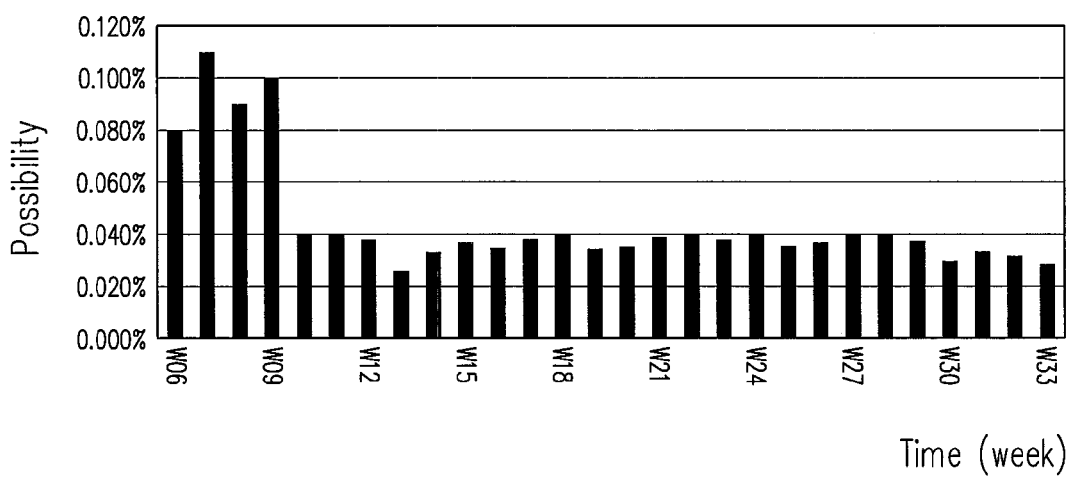
FIG. 9 is a trend chart illustrating a probability for the wafer to be rejected.

FIG. 8 is a trend chart illustrating a number of the wafers being rejected. FIG. 9 is a trend chart illustrating a probability for the wafer to be rejected.

Referring to FIG. 8, a horizontal axis represents time in weeks; and a vertical axis represents a number of lots of the wafer rejected by the stepper. W06 to W09 are a result obtained without using a monitoring method of the invention. W10 to W33 are a result obtained by using the monitoring method of the invention.

According to the results in FIG. 8, it shows that: during a period from W06 to W09, the wafers rejected by the stepper is approximately 15 lots per day; and during a period from W10 to W33, the wafers rejected by the stepper is approximately 5 lots per day. In view of the results in FIG. 8, it can be known that, the number of the wafers being rejected by the stepper may be substantially reduced after using the monitoring method of the invention. Further, as shown from other data, most of the wafers not being rejected may pass subsequent electrical inspections.

Referring to FIG. 9, a horizontal axis represents time; and the vertical axis represents the probability for the wafers rejected by the stepper. W06 to W09 are a result obtained without using the monitoring method of the invention. W10 to W33 are a result obtained by using the monitoring method of the invention. In view of the results in FIG. 9, it can be known that, the probability for the wafers to be rejected by the stepper is dropped from approximately 0.09% to 0.035% after using the monitoring method of the invention which is capable of substantially reduce the probability for the wafers to be rejected by the stepper.

In view of above, the method of manufacturing semiconductor and the exposure system provided by the invention are capable of comprehensively considering a plurality of factors influencing the exposure. Therefore, the frequency of the false warning due to single factor sent by an exposure machine may be effectively reduced to avoid unnecessary reworks, and alignment behaviors between layers may be effectively monitored. In particular, the invention is capable of effectively monitoring alignment behaviors between layers while substantially reducing the number of wafer being rejected as well as the possibility for the wafer to be rejected, so as to further improve production capacity.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method of manufacturing semiconductor, comprising:
    forming a material layer on a substrate;
    forming a patterned photoresist layer on the material layer and producing a monitor parameter group including a plurality of monitor parameters from a state information of the patterned photoresist layer;
    calculating the monitor parameter group based on a mathematic formula to obtain a virtual parameter; and
    performing a layout process on the material layer when the virtual parameter is less than a reference value,
    wherein the mathematic formula is:

$$V=|C_1 \times T + C_2 \times R + C_3 \times O + C_4 \times E| \quad (1)$$

in formula (1), V is a virtual parameter; T, R, O, E are monitor parameters in practical operation of an alignment machine for forming the patterned photoresist layer, wherein T is a value of the translation factor, R is a value of the rotation factor, O is a value of the orthogonality factor, and E is a value of the expansion factor; and $C_1$, $C_2$, $C_3$ and $C_4$ are environmental constants; and the reference value is:

$$B = k \times N \quad (2)$$

in formula (2), B is the reference value; k is an environmental constant; and N is defined as formula (3) below:

$$N=|C_1 \times T' + C_2 \times R' + C_3 \times O' + C_4 \times E'| \quad (3)$$

in formula (3), T', R', O', E' are values of control parameters set to the alignment machine, wherein T' is a value of the translation factor; R' is a value of the rotation factor; O' is a value of the orthogonality factor; E' is a value of the expansion factor; and $C_1$, $C_2$, $C_3$ and $C_4$ are the environmental constants as defined above.

2. The method of manufacturing semiconductor of claim 1, wherein the state information of the patterned photoresist layer is indicated by at least one overlay difference between at least one alignment mark of the substrate and at least one alignment mark of a photomask.

3. The method of manufacturing semiconductor of claim 2, wherein the monitor parameter group comprises at least one vector-oriented factor and at least one non vector-oriented factor, the at least one vector-oriented factor comprises a rotation factor, an orthogonality factor and an expansion factor, and the at least one non vector-oriented factor comprises a translation factor.

4. The method of manufacturing semiconductor of claim 1, further comprising outputting the state information of the patterned photoresist layer to a control system to generate a batch report comprising the monitor parameter group.

5. The method of manufacturing semiconductor of claim 1, wherein a warning is sent when the virtual parameter is greater than the reference value.

6. The method of manufacturing semiconductor of claim 1, wherein the layout process comprises an etching process for patterning the material layer.

7. The method of manufacturing semiconductor of claim 1, wherein the layout process comprises an ion implantation process.

8. An exposure system, comprising:
    a stepper;
    a monitor device connected to the stepper, storing a state information of a patterned photoresist layer after an exposure step is performed and producing a monitor parameter group from the state information of the patterned photoresist layer, calculating the monitor parameter group based on a mathematic formula to obtain a virtual parameter, and performing a layout process on a material layer located under the patterned photoresist layer when the virtual parameter is less than a reference value,
    wherein the monitor device comprises an alignment monitor device installed in the stepper, the state information of the patterned photoresist layer is indicated by at least one overlay difference between at least one alignment mark of the substrate and at least one alignment mark of a photomask, the monitor parameter group comprises at least one vector-oriented factor and at least one non vector-oriented factor, the at least one vector-oriented factor comprises a rotation factor, an orthogonality factor and an expansion factor, and the at least one non vector-oriented factor comprises a translation factor; and
    the mathematic formula comprises:

$$V=|C_1 \times T + C_2 \times R + C_3 \times O + C_4 \times E| \quad (1)$$

in formula (1), V is a virtual parameter; T, R, O, E are monitor parameters in practical operation of an alignment machine for forming the patterned photoresist layer; wherein T is a value of the translation factor; R is a value of the rotation factor; O is a value of the orthogonality factor; E is a value of the expansion factor; and $C_1$, $C_2$, $C_3$ and $C_4$ are environmental constants; and the reference value is:

$$B = k \times N \quad (2)$$

in formula (2), B is the reference value; k is an environmental constant; and N is defined as formula (3) below:

$$N=|C_1 \times T' + C_2 \times R' + C_3 \times O' + C_4 \times E'| \quad (3)$$

in formula (3), T', R', O', E' are values of control parameters set to the alignment machine, wherein T' is a value of the translation factor; R' is a value of the rotation factor; O' is a value of the orthogonality factor; E' is a value of the expansion factor; and $C_1$, $C_2$, $C_3$ and $C_4$ are the environmental constants as defined above.

9. The exposure system of claim 8, wherein the monitor device is installed in a control system, and the control system outputs a batch report comprising the monitor parameter group.

10. A method of manufacturing semiconductor, comprising:
    forming a material layer on a substrate;
    forming a patterned photoresist layer on the material layer and producing a monitor parameter group including a plurality of monitor parameters from a state information of the patterned photoresist layer, wherein the state information of the patterned photoresist layer is indicated by at least one overlay difference between at least one alignment mark of the substrate and at least one alignment mark of a photomask;

calculating the monitor parameter group based on a mathematic formula to obtain a virtual parameter, wherein the mathematic formula is:

$$V=|C_1\times T+C_2\times R+C_3\times O+C_4\times E| \qquad (1)$$

in formula (1), V is a virtual parameter; T, R, O, E are monitor parameters in practical operation of an alignment machine for forming the patterned photoresist layer, wherein T is a value of a translation factor, R is a value of a rotation factor, O is a value of an orthogonality factor, and E is a value of an expansion factor; and $C_1$, $C_2$, $C_3$ and $C_4$ are environmental constants; and the reference value is:

$$B=k\times N \qquad (2)$$

in formula (2), B is the reference value; k is an environmental constant; and N is defined as formula (3) below:

$$N=|C_1\times T'+C_2\times R'+C_3\times O'+C_4\times E'| \qquad (3)$$

in formula (3), T', R', O', E' are values of control parameters set to the alignment machine, wherein T' is a value of a translation factor; R' is a value of a rotation factor; O' is a value of an orthogonality factor; E' is a value of an expansion factor; and $C_1$, $C_2$, $C_3$ and $C_4$ are the environmental constants as defined above;

performing a layout process on the material layer when the virtual parameter is less than a reference value; and sending a warning when the virtual parameter is greater than the reference value.

11. The method of manufacturing semiconductor of claim 10, wherein the layout process comprises an etching process for patterning the material layer.

12. The method of manufacturing semiconductor of claim 10, wherein the layout process comprises an ion implantation process.

13. A method of manufacturing semiconductor, comprising:

forming a material layer on a substrate;

forming a patterned photoresist layer on the material layer and producing a monitor parameter group including a plurality of monitor parameters from a state information of the patterned photoresist layer;

calculating the monitor parameter group based on a mathematic formula to obtain a virtual parameter; and performing a layout process on the material layer when the virtual parameter is less than a reference value, wherein the monitor parameter group comprises a maximum value and a minimum value of a local defocus result, a maximum value and a minimum value of a leveling error result, and a maximum value and a minimum value of an alignment result, wherein the mathematic formula comprises:

a range of each of the monitor parameters=the maximum value of each of the monitor parameters−the minimum value of each of the monitor parameters, wherein the range of each of the monitor parameters is the virtual parameter.

14. An exposure system, comprising:

a stepper;

a monitor device connected to the stepper, storing a state information of a patterned photoresist layer after an exposure step is performed and producing a monitor parameter group from the state information of the patterned photoresist layer, calculating the monitor parameter group based on a mathematic formula to obtain a virtual parameter, and performing a layout process on a material layer located under the patterned photoresist layer when the virtual parameter is less than a reference value, wherein the monitor parameter group comprises a maximum value and a minimum value of a local defocus result, a maximum value and a minimum value of a leveling error result, and a maximum value and a minimum value of an alignment result, wherein the mathematic formula comprises:

a range of each of the monitor parameters=the maximum value of each of the monitor parameters−the minimum value of each of the monitor parameters, wherein the range of each of the monitor parameters is the virtual parameter.

* * * * *